United States Patent
Taylor

(10) Patent No.: US 6,555,170 B2
(45) Date of Patent: *Apr. 29, 2003

(54) PRE-PLATE TREATING SYSTEM

(75) Inventor: James M. Taylor, Yoba Linda, CA (US)

(73) Assignee: Duratech Industries, Inc., Orange, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 09/779,870

(22) Filed: Feb. 8, 2001

(65) Prior Publication Data

US 2001/0013473 A1 Aug. 16, 2001

Related U.S. Application Data

(63) Continuation-in-part of application No. 09/016,048, filed on Jan. 30, 1998, now Pat. No. 6,174,561.
(60) Provisional application No. 60/180,917, filed on Feb. 8, 2000.

(51) Int. Cl.$^7$ .............................. B05D 3/04; C25D 5/34
(52) U.S. Cl. ................. 427/302; 427/372.2; 427/388.1; 427/421; 205/210; 205/215
(58) Field of Search .............................. 106/105, 14.15, 106/14.42, 14.44, 14.18; 205/210, 215; 148/243, 282; 427/96, 302, 372.2, 388.1, 421

(56) References Cited

U.S. PATENT DOCUMENTS

| | | | |
|---|---|---|---|
| 3,349,043 A | 10/1967 | Manning | |
| 3,726,704 A | * 4/1973 | Shimada | 117/51 |
| 4,127,438 A | 11/1978 | Babcock et al. | |
| 4,163,727 A | 8/1979 | Inks | |
| 4,281,037 A | 7/1981 | Choung | |
| 4,379,834 A | 4/1983 | Herwig et al. | |
| 4,510,018 A | * 4/1985 | McGowan | 156/666 |
| 4,656,097 A | 4/1987 | Claffey et al. | |
| 5,039,472 A | 8/1991 | Salensky et al. | |
| 5,077,176 A | 12/1991 | Baggio et al. | |
| 5,166,037 A | 11/1992 | Atkinson et al. | |
| 5,445,698 A | 8/1995 | Takano et al. | |
| 5,543,182 A | 8/1996 | Joshi et al. | |
| 5,614,324 A | 3/1997 | Poutasse et al. | |
| 5,621,068 A | 4/1997 | Okamoto et al. | |
| 5,665,525 A | 9/1997 | Pienimaa | |
| 5,679,230 A | 10/1997 | Fatcheric et al. | |
| 6,066,197 A | * 5/2000 | Bristol et al. | 106/14.42 |
| 6,174,561 B1 | * 1/2001 | Taylor | 427/96 |

FOREIGN PATENT DOCUMENTS

| | | |
|---|---|---|
| EP | 57076197 | 5/1982 |
| EP | 61048583 | 3/1986 |
| EP | 0178864 A2 | 4/1986 |
| EP | 61166986 | 7/1986 |
| EP | 02015185 | 1/1990 |
| EP | 03229887 | 10/1991 |
| GB | 2234194 A | 1/1991 |
| JP | 58061293 | 12/1983 |
| WO | WO-9619097 | 6/1996 |

* cited by examiner

*Primary Examiner*—Brian K. Talbot
(74) *Attorney, Agent, or Firm*—Knobbe Martens Olson & Bear LLP

(57) ABSTRACT

The invention relates in general to a method of electroplating substrates where at least a portion of the substrate is coated with a solution containing a film forming amine and sufficient acid to produce a pH of less than 6.5. The acid helps to clean the surface of the substrate, and the film forming amine forms a film on the surface of the substrate. Electroplating proceeds with greatly improved speed and efficiency, especially in low current areas.

24 Claims, No Drawings

PRE-PLATE TREATING SYSTEM

RELATED APPLICATIONS

This application is a continuation-in-part of Application No. 09/016,048, filed Jan. 30, 1998, now U.S. Pat. No. 6,174,561. This application also claims the benefit of U.S. Provisional Application No. 60/180,917, filed Feb. 8, 2000, under 35 U.S.C. §119(e).

BACKGROUND OF THE INVENTION

1. Field of the Invention

The present invention relates in general to a method of electroplating based on coating the surface to be electroplated with filming amines such that electroplating proceeds with greatly improved speed and efficiency, especially in low current areas.

2. Description of Related Art

The metal finishing industry utilizes many types of processes, among them the electroplating of dissimilar metals, one onto another, as well as the electroplating of similar metals. In the fabrication of circuit boards, for example, copper is plated on top of copper to selectively build up the circuits.

Regardless of the type of electroplating, the first step is cleaning the substrate metal such that little or no contamination remains to interfere with the flow of ions from the anode to the substrate metal. Contamination takes the form of oxides, greases, oils, fingerprints, and the like. The contamination must be removed and the substrate metal made sufficiently active to allow the plating function to begin. This pre-plate cleaning often takes the form of immersion in multiple hot alkaline soak solutions, followed by one or more acid soak baths to activate the metal substrate and to remove any built up oxides. Oxides form extremely rapidly during rinsing cycles between the various cleaning and activating steps, and the presence of any oxides inhibits efficient plating.

Additionally, the plating cycle itself is slow and represents one of the more time consuming and difficult steps in the production cycle. Parts with odd shapes add to the problem, because low current density areas do not plate as quickly as the rest of the part. Thus excess plating in the high current density areas results from the extended plating time and/or increased amperage needed to adequately plate the low density areas. When holes are present in the article to be plated, the deposited coating on the interior of the hole is thicker at the top and bottom of the hole than at the center of the hole. The uneven coating where the plating on the exterior of the hole is thicker than the interior of the hole is known as "dog boning".

The throwing power of an electroplating bath is the ratio of the current flowing at the center of the hole to the current flowing at the ends of the hole. A plating bath which has high throwing power has relatively equal flow of current at the center of the hole and the ends of the hole. A bath with high throwing power would plate the interior of the hole evenly from top to bottom. Uneven plating of the interior of the hole of circuit boards can lead to defects in the circuit board. There is thus a need for a method that cleans and activates parts and facilitates rapid, uniform electroplating.

SUMMARY OF THE INVENTION

One aspect of the invention involves a method of electroplating a substrate. The method involves obtaining a solution containing from about 0.0003% to about 30% of a film forming amine and sufficient acid to produce a pH of less than about 6.5. The method also includes coating at least a portion of the substrate with the solution, thereby forming a film on the substrate; and plating the substrate.

Advantageously, the coating involves immersing the substrate in the solution. In an embodiment, the coating involves spraying at least a portion of the substrate with the solution. Preferably, the substrate is rinsed after the coating.

In an embodiment, the solution contains a plurality of film forming amines. Advantageously, the solution includes a plurality of acids. Preferably, the acid is phosphoric acid, sulfonic acid, hydroxyacetic acid, hydrochloric acid, sulfuric acid, sulfonic acid, formic acid, malonic acid, succinic acid, aspartic acid, mallic acid, acetic acid, citric acid, nitric acid, methane sulfonic acid, gallic acid, maleic acid, or fumaric acid.

Preferably, the solution is diluted to not less than about 1% of its initial concentration. Advantageously, the substrate is dried after the coating. In an embodiment, the film forming amine inhibits oxidation of the substrate. Preferably, the acid reduces the pH of the solution to below 4.

The film forming amine may be a fatty acid amine or a long chain alkylamine. Advantageously, the film forming amine is a primary amine, a secondary amine, a tertiary amine, an alkylamine, a C-8 through C-22 amine, a basic mono cyclic tertiary amine, a stabilized abietylamine, a diaminopropane, a dehydroabietylamine, or an ethoxylate, salt, or adduct thereof.

Preferably, the solution cleans the substrate. Advantageously, a resist layer is deposited on at least a portion of the film. In an embodiment, at least a portion of the resist layer is removed. The method may also include pattern plating the substrate. The substrate may also be contacted with an acid pickle solution containing a film forming amine, where the contacting is before plating. The coating of the substrate may be repeated after plating. Preferably, the substrate is plated again after repeating the coating. The plating may be performed in a solution which contains a film forming amine.

DETAILED DESCRIPTION OF THE PREFERRED EMBODIMENT

The embodiments of the present invention relate to a method of electroplating in which the substrate to be electroplated can be prepared for electroplating in a single step. Further, both the speed and the efficiency of electroplating are increased with the embodiments of the method, especially in low current density areas such as the interior of holes. When an embodiment of the method was used to plate steel door hinges, the steel door hinges were plated in about a quarter of the time and with greater than ⅔ reduction in energy consumption compared to conventional plating. This is even more surprising, because the embodiments of the present invention do not activate but rather passivate metals.

The embodiments of the method include the use of a solution to prepare the substrate for electroplating. The solution comprises (1) a filming amine or combination of filming amines, (2) an acid or combination of acids, and (3) water. A surfactant can optionally be added to assist in cleaning and wetting of the substrates. The surfactant can also act as an antifoaming agent. The solution of the embodiments of the present invention may also be used as a cleaner or as a substitute for an acid pickle, where additional wetting agents are not required.

For purposes of this invention, a substrate is considered to be prepared for electroplating when the substrate is clean such that little or no contamination remains to interfere with the flow of ions from the plating solution to the substrate metal and when a layer of filming amine or a combination of filming amines is present on the surface of the substrate.

In addition, the solution may be used for cleaning and priming substrates, inner layer core materials, and flexible composite materials used in the manufacture of PCBs (printed circuit boards).

A filming amine is defined as a primary, secondary, tertiary or quaternary amine or derivatives thereof in which the group(s) attached to nitrogen are sufficient to cause a solution of the amine, when placed upon a substrate having a charge, to form a continuous layer when the pH of the solution is below 7. An acid is defined as a compound that, when placed in pure water with a pH of 7, causes the pH to drop below 7. A surfactant is defined as a compound which lowers the surface tension of the solution.

A wide variety of film forming amines can be used in the present invention. Preferable filming amines may be either cationic, amphoteric or nonionic. Neutral and anionic amines may also be used but do not tend to work well unless used with a strongly acid medium. Preferable filming amines may include, but are not limited to, fatty acid amines and long chain alkylamines. Amines used in embodiments of the method of the present invention can be prepared by methods known to those skilled in the art or may be purchased from any of a number of commercial sources. Preferable amines include, but are not limited to, primary, secondary and tertiary amines; diamines; alkylamines; $C_8$ through $C_{22}$ amines; basic mono cyclic tertiary amines; abietylamines; diaminopropanes; dehydroabietylamines; and ethoxylates, salts, and adducts thereof. For example, amines can be obtained from Akzo Chemicals Inc., under the tradename Armeen for primary, secondary and tertiary amines, and under the tradename Duomeen for diamines.

Fatty acid amines can be prepared by methods known to those skilled in the art by reacting fatty acids with ammonia or ammonia derivatives. The molecular structure of fatty acid amines is characterized by a central nitrogen atom as in ammonia ($NH_3$) having one or all of its hydrogens replaced by a fatty acid group R. A fatty acid amine may also be a quaternary amine, wherein the central nitrogen atom is bonded to four fatty acid groups. Each fatty acid group, R, is a long chain, preferably $C_8$–$C_{22}$, preferably aliphatic, alkyl group having a terminal carboxylic acid function. The alkyl chain(s) of the R group may be unsaturated or have additional substituents. Because of the number of carbon atoms in the alkyl group, this group is strongly hydrophobic. However, the nitrogen atom is hydrophilic, particularly when it has four R groups or three R groups and is protonated. When dissolved or dispersed in water or non-aqueous solvents, one portion of the molecule is strongly repelled by its surrounding solvent. This repelling force tends to orient the molecules at surfaces or interfaces or cause them to form micelles when in solution.

Preferable fatty acid amines include, but are not limited to, amines having R groups derived from animal and vegetable fatty acids or oils, such as tall oil, oleic oil, caprylic oil, and coconut oil.

More preferable filming amines are commercially available from Hercules, Inc. Resins Group under the trademark Polyrad®. Polyrad® filming amines are 5- and 11-mole ethylene oxide adducts of a rosin-derived primary amine to which are added 15% and 10% of the unadducted amine. The most preferable Polyrad® filming amines are Polyrad® 0515 (the 5 mole ethylene oxide adduct) and Polyrad® 1110 (the 11 mole ethylene oxide adduct). Other more preferable filming amines include organic monobasic cyclic tertiary amines commercially available from Mona Industries, Inc. under the tradename MONAZOLINE™. MONAZOLINE™s are 1-hydroxyethyl-2 alkylimidazolines. The general structure is:

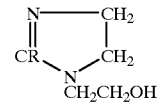

where R represents alkyl groups having 7–17 carbon atoms. Most preferable MONAZOLINE™ filming amines are MONAZOLINE T™ and MONAZOLINE C™. Other more preferable filming amines are commercially available from Akzo Chemicals Inc. under the tradename Ethoduomeen®. The filming amines sold under the tradename Ethoduomeen® are ethoxylated diamines prepared by the reaction of 3, 10, or 15 moles of ethylene oxide with Duomeen® T (N-tallow-1,3-diaminopropanes). Most preferable Ethoduomeen® filming amines are Ethoduomeen® T/13 (ethoxylated (3) N-tallowalkyl-1,3-diaminopropanes), Ethoduomeen® T/20 (ethoxylated (10) N-tallowalkyl-1,3-diaminopropanes), and Ethoduomeen® T/25 (ethoxylated (15) N-tallowalkyl-1,3-diaminopropanes).

Filming amine properties particularly useful in the present invention include, but are not limited to, hydrophobicity, fast film formation, resistance to wash-off, film persistency, oxidation inhibition, cleaning, and wetting. Hydrophobicity results from the attraction between the positive charge on the filming amine and the negative charge characteristic of most substrate surfaces. Preferable filming amines form the hydrophobic film, or layer, immediately upon contact with the substrate and are resistant to water wash-off and other film degradation. The attraction between the positively charged filming amine and negatively charged substrate surface also causes adsorption and surface modification which assists in oxidation inhibition and adhesion promotion and reduction of hydrogen embrittlement in susceptible metals and alloys. Also, the amphoteric molecular structure of the filming amine provides for molecular orientation at interfaces. This orientation reduces interfacial tension which assists in substrate cleaning and wetting. To obtain these preferred properties, the solution can use one or more filming amines.

For example, preferable filming amines that create an adequate hydrophobic layer include Polyrad®, MONAZOLINE™, and Ethoduomeen®. More preferable filming amines that create an adequate hydrophobic layer include Polyrad® 0515, MONAZOLINE T™ and Ethoduomeen® T/13. Preferable filming amines include Polyrad® and Ethoduomeen®, such as Polyrad® 1110 and Ethoduomeen® T/25.

To produce the solution used in the present invention, the above-described filming amine(s) are combined with a suitable acid or combination of acids. The acid(s) should be capable of reducing the solution below a pH of 7 when introduced to the filming amine. Sufficient acid is added to the filming amine to neutralize at least the majority of the amine. It is generally preferred that sufficient acid be added to neutralize the amine. In an exemplary embodiment, sufficient acid is added to provide more acid than would be required to neutralize the amine. Preferably, sufficient acid is added to reduce the pH in the solution to less than about 6.5. More preferably, sufficient acid is added to reduce the pH in the solution to less than about 4.

Preferable acids include organic and inorganic acids. More preferable acids include phosphoric, sulfonic, and hydroxyacetic acids. Most preferable acids include hydrochloric, sulfuric, methane sulfonic and sulfamic acids. Other preferable acids include formic, malonic, succinic, aspartic, mallic, acetic, citric, nitric, phosphoric, sulfonic, methane sulfonic, sulfamic, fluoboric, and hydroxyacetic acids. Gallic, maleic and fumaric acids are the most preferable acids.

The solution preferably comprises from about 0.0003% to 30.0%, by weight, of a filming amine(s) together with an acid(s) capable of dropping the pH to pH 7 or below. More preferably, the solution comprises from about 0.0008 to about 8.0%, by weight, of a filming amine(s) together with an acid(s) capable of dropping the pH below 6.5. Most preferably, the solution comprises from about 0.02% by weight to about 0.2% by weight of a filming amine together with an acid capable of reducing the pH below about 7.

When mixed, the filming amine(s) and acid(s) form cationic molecules with a strong positive charge, which readily bond to negatively charged substrates. This bonding forms a self-limiting hydrophobic layer on the substrates. The free acid above the amount required to neutralize the amine removes contamination and oxides on the substrates and assists in strengthening the hydrophobic bond. The hydrophobic bond also inhibits acidic attack of the substrates to which it is bonded, but does not inhibit acidic attack on non-charged surfaces or oxides. Thus, the combination of the filming amine(s) and acid(s), forms a hydrophobic layer which assists in the removal of contaminants from substrate materials. More specifically, the combination of the filming amine(s) and acid(s), forms a fast film forming, wash-off resistant, film persistent, hydrophobic layer which displaces contaminants from substrates. Exposing the substrate to the combination of the filming amine(s) and acid(s) primes the substrate for plating. The combination also functions as a cleaner, oxidation inhibitor, adhesion promoter, flexibility enhancer, redeposition inhibitor, and etch enhancer.

The solution further comprises a carrier, or solvent, for the filming amine(s) and acid(s). The solvent preferably comprises deionized water. Ordinary tap water can be used, but is not preferred because of the extraneous metallic ions that may be found in tap water. Distilled water is not as preferred as deionized water only because of its relatively high cost. Organic solvents, such as but not limited to, glycol ethers and alcohols may be used in addition to water. Organic solvents are particularly useful to help solubilize filming amines and amine salts with higher molecular weights. However, organic solvents are typically considered volatile organic compounds (VOCs) by government agencies.

The solution optionally further comprises a surfactant. Although not required, the surfactant increases cleaning activity, assists in chromate removal, functions as a wetting agent, and/or reduces foaming of the solution. The surfactant lowers the surface tension of the solution, preferably to less than 70 dynes/cm$^2$, more preferably to less than 50 dynes/cm$^2$, and most preferably to less than 30 dynes/cm$^2$. In general, solutions having low surface tensions wet and clean the substrate more effectively than solutions having high surface tensions. Contaminants must be removed before the filming amine can bond to the substrate. If contaminants are not present on the surface of the substrate, as when a clean part is placed in an acid pickle, no added wetting agents are generally required. Preferable surfactants are commercially available from Rhone-Poulenc under the tradename Antarox. More preferable surfactants include Antarox LF 224 and Antarox BL-214.

Additionally, an etching component can be added to the solution to aid in contaminant removal and cleaning. Preferable etching components include, but are not limited to, iron salts, peroxides, persulfates, and other oxidizers. Sodium nitrobenzene sulfonate (MBS) is an exemplary etching component. Other preferable etching components include ferric chloride and cupric chloride.

Colorants or dyes can be added to the solution to, among other purposes, identify the solution. Stabilizers can be added to the solution to, among other purposes, stabilize the solution. Stabilizers may be added, for example, when the solution includes peroxysulfuric acid as an etchant. Perfumes can be added to the solution to, among other purposes, cover or remove the odor of the solution. Also, other ingredients can be added to the solution to assist in preparing the substrate for electroplating, including but not limited to, cleaning, oxidation inhibition, redeposition inhibition, hydrogen embrittlement reduction, wetting or any combination of the above.

Thus, the preferred components of the solution used to prepare substrates in the method of the present invention comprise a filming amine(s) which is mixed with an appropriate acid(s) in amounts adequate to form a hydrophobic layer on the substrate. Water is preferably used as the solvent, and a surfactant can be optionally added to aid in the cleaning, anti-foaming or wetting of the substrates. Examples of the solution are provided below:

EXAMPLE 1

A solution was made by placing about 20 gallons of deionized water into a clean 50 gallon mixing tank at ambient room temperature. About 20 ounces, by weight, of Polyrad 0515 filming amine was added and stirred into the water. Then, hydrochloric acid was mixed into the solution so that the concentration of the acid, by volume, was about 50% and the concentration of the filming amine, by weight, was about 0.28%. About 5 pounds of Antarox LF 222 (a surfactant) was then mixed into the solution.

EXAMPLE 2

A solution was made by placing about 20 gallons of distilled water into a clean 50 gallon mixing tank at ambient room temperature. About 18 ounces, by weight, of Polyrad 0515 filming amine was added and dispersed into the water. An additional 18 ounces of Polyrad 1110 filming amine was then added and dispersed into the tank to give an amine content of about 0.5% by weight. Next, a 70% hydroxyacetic acid solution (commercially called glycolic acid) was slowly added until the solution became clear to form a hydroxyacetic acid salt with a pH of 7 or below. Then, sufficient muriatic acid (hydrochloric acid) was mixed into the solution so that solution was about 50% acid by volume, and the concentration of the filming amine was about 0.5 weight %.

EXAMPLE 3

A solution was made by placing about 20 gallons of deionized water into a clean 50 gallon mixing tank at ambient temperature. MONAZOLINE T™ filming amine and muriatic acid (hydrochloric acid) were added to the tank and mixed in amounts sufficient to make the concentration of MONAZOLINE™ about 0.6 weight % and the concentration, by volume, of muriatic acid about 25%. Then, about 22 pounds, or 5% by weight, of ferric chloride hexahydrate was added (as an etching agent). The solution was then mixed until clear.

The solution of Example 3 was found to permit plating under the adverse circumstances in which Ni was plated on Cu at a pH of about 4, containing no additives, and having a surface tension of 65–68 dynes/cm$^2$. The plating was successful even though no additives such as brighteners or levelers were present in the plating solution and in spite of the high surface tension of the plating solution.

EXAMPLE 4

A solution was made by placing about 2 gallons of tap water into a clean 5 gallon mixing tank at room temperature. About 2 ounces, by weight, of MONAZOLINE T™ filming amine and sufficient acetic acid to form a neutral solution were added to the solution. Next, about 20%, by volume, of muriatic acid and 30%, by volume, of phosphoric acid was mixed into the tank. The resulting solution was then 50% acid by volume, and about 0.08%, by weight, of a filming amine. About 1% of Antarox LF 224 was mixed into the solution as a nonionic wetting agent.

EXAMPLE 5

A solution was made by mixing about 16 gallons of distilled water and about 4 gallons of isopropyl alcohol in a clean 50 gallon mixing tank at room temperature. About 18 ounces, by weight, of Ethoduomeen® T/13 filming amine was added so that the concentration, by weight, of the filming amine was about 0.3%. About 1% of Antarox BL-214 was mixed into the solution. Sufficient hydrochloric acid was added to the solution to make the solution about 50% hydrochloric acid by volume.

EXAMPLE 6

A solution was made by mixing about 20 gallons of deionized water in a clean 50 gallon mixing tank at room temperature. About 20 ounces, by weight, of Ethoduomeem T/13 filming amine was added. Maleic acid was then added until the solution was neutral. Hydrochloric acid was then added to a final acid concentration of about 50%, by weight. About 2% of Antarox LF 222 was mixed into the solution. Next, about 0.001 wt % FD&C Blue #1 dye, about 0.001 wt % Uranine dye, and about 10%, by volume, of diethylene glycol butyl ether was added.

An exemplary solution according to an embodiment of the present invention is prepared in the following manner. For exemplary purposes, a solution comprising 1 filming amine, 1 acid, and 1 surfactant is detailed. A clean 50 gallon container is filled with approximately 20 gallons of distilled water at ambient room temperature. Approximately 20 ounces, by weight, of Polyrad® 0515 filming amine is added and stirred into the container. Stirring is preferably performed with a conventional stirring blade for approximately 10 minutes so that the filming amine is adequately dispersed in the water. When adequately dispersed, the solution becomes hazy. Then, approximately 25 gallons of hydrochloric acid is added into the container so that the amount of the acid, by volume, is 50% of the solution and the amount of the filming amine, by volume, is about 0.28%. The solution is stirred for approximately 30 minutes so that the acid is adequately dispersed in the solution. Approximately 1%, by volume, of a Antarox LF 224 is added and stirred into the container.

For exemplary purposes again, a solution comprising 1 filming amine and 2 acids is detailed. A clean 50 gallon container is filled with approximately 20 gallons of deionized water at ambient room temperature. Approximately 20 ounces, by weight, of Polyrad® 0515 filming amine is added and stirred into the container. Stirring is preferably performed with a conventional mixing blade for approximately 10 minutes so that the filming amine is adequately dispersed in the water. When adequately dispersed, the solution is hazy. Then, approximately 0.1 gallons, by volume, of hydroxyacetic acid is added and stirred into the container for approximately 10 minutes or until the mixture is neutralized. The solution is adequately mixed when it appears clear. The solution may be optionally heated to facilitate neutralization. Approximately 25 gallons of hydrochloric acid is then added to the container until the final amount of the hydrochloric acid, by volume, in the solution is about 50%.

The solution is preferably prepared in the above-described manner, stored in containers and diluted on-site for application onto substrates. The solution is preferably diluted to 1%–25%, by volume, of the original concentration. The solution is more preferably diluted to about 5% to 20% of the original concentration. The solution is most preferably diluted to about 10% of the original concentration.

A 10% dilution (for exemplary purposes) of the solution is performed by the following steps. A 50 gallon container is filled with 45 gallons of water, preferably distilled. The container is preferably constructed of plastic or composites. Metal is not as preferred, because metals are more reactive than plastic or composites and are more readily attacked by the acid(s) in the solution. The water is heated to approximately 55 to 125 degrees Fahrenheit and more preferably 75 to 105 degrees Fahrenheit and most preferably 85 to 95 degrees Fahrenheit. 5 gallons of the solution is then added and stirred into the container. Stirring is preferably performed with a conventional mixing blade for approximately 5 minutes so that the solution is adequately dispersed in the water as described above. The diluted solution may be contacted with the substrate at room temperature or at elevated temperature.

Solutions which have been diluted to from 1% to 25% of the original concentration can be prepared in a manner similar to that disclosed above. Solution concentrations will vary depending on several factors. One such factor includes the length of time the solution will be in contact with the substrate. Typical contact times range from about 10 seconds to about 10 minutes. Another factor which affects the preferred concentration percentage is the temperature at which the solution is applied to the substrate. In general, the higher the temperature, the faster the chromate removal process is performed. Containers ranging in sizes from 1 gallon to 5,000 gallons can be used to prepare the diluted solution. The range is mostly dependent upon the size and quantity of the substrates as well as the time which the substrates are in contact with the solution.

The solution disclosed herein functions as, but is not limited to, a cleaner, a hydrogen embrittlement inhibitor, a plating enhancer, an oxidation inhibitor, an adhesion promoter, a flexibility enhancer, a redeposition inhibitor, an etch enhancer, a wetter, a dry solder flux, or any combination of the above.

As a cleaner, the solution loosens and removes fingerprints, oils, greases, dirt, contaminants and the like on substrates. This provides an initial cleaning of the substrates as a part of substrate priming and subsequent processing.

The solution also functions as an oxidation inhibitor. Oxidation is inhibited by the hydrophobic filming amine layer formed by the solution onto the substrate. The amine layer functions as a barrier between the substrate and oxygen sources such as acid fumes and the environment, allows soldering without a flux, and improves soldering when a flux is used.

The solution also promotes adhesion of resists to substrates. The hydrophobic layer which displaces the chromate on the substrate functions as a chemical bonding agent for resists. Resists usually comprise photoresists or screen inks and are typically applied after the substrate is primed to define the circuit images. This greatly reduces, if not entirely eliminates, problems arising from marginal adhesion to thin substrates that cannot be easily scrubbed or surface etched.

The solution also dispenses with the requirement for a surface etch. Surface etches are commonly performed on substrates used in PCB processing. A surface etch is not required due to the strength of the chemical bond between the filming amine layer and the resist. The strength of the chemical bond is especially strong when the substrate is metallic. Thus, copper material can be used as a substrate because of the substantial reduction in copper removal from the substrate. Additionally, an etching component, such as an iron salt, can be mixed with the solution or incorporated into the solution to provide faster chromate removal and/or greater adhesion of the resist (as discussed above).

The solution also functions as a redeposition inhibitor. Redeposition of chromate, contaminants, and the like is inhibited by the hydrophobic filming amine layer which the solution forms onto the substrates.

The process of using the solution to prepare substrates for electroplating comprises preparing the solution, coating at least a portion of the substrates with the solution, rinsing the substrate, and plating in a conventional manner. Although rinsing is optional, rinsing is generally preferred, because excess amine may be present on the surface if the substrate if the substrate is not rinsed. If the substrate is not rinsed, the excess amine would change the composition of the plating bath in an uncontrolled manner. If the composition of the plating bath is to be changed, it is generally preferred to change the composition in a controlled fashion.

In an exemplary embodiment, the substrate is coated with the solution, is rinsed, and is plated for a period of time. The plating is preferably stopped before or just after "dog-boning" starts to occur. The substrate is then removed from the plating bath, is coated again with the solution, and is plated again. By removing the substrate from the plating bath and recoating with the solution according to embodiments of the present invention, the amount of "dog-boning" can be minimized and the high aspect hole plated at faster rates for thicker deposits in less time.

The process of using the solution to prime substrate materials used in PCB fabrication comprises preparing the solution, coating at least a portion of the substrates with the solution, rinsing the substrates and then drying the substrates. This process is detailed below. It is not necessary that all substrates become hydrophobic or stay hydrophobic during processing in order to derive the benefits outlined above.

Preparing the solution, whether in concentrated or diluted form, is performed as explained above.

The substrates can then be coated with the solution in a variety of ways, such as, but not limited to, immersion, spraying, flood coating, curtain coating or waterfalling. Irrespective of the coating technique used, the container which holds the solution is preferably dimensioned and arranged to be integrated into an assembly line type operation so that substrate coating is also part of the manufacturing operation. The preferred immersion time varies between 5 seconds to 5 minutes, more preferably for 30 seconds to one minute, and most preferably until the substrate is prepared for electroplating, any unwanted contaminate is removed and the substrate is treated. The coating step is repeated as many times as necessary (or the substrate is coated as long as required) to adequately coat the substrate as explained above.

The substrate is then preferably rinsed to remove solution residue. However, rinsing is not required. Rinsing is performed by coating the substrates with a solution, such as, but not limited to water, organic solvents and the like. Preferably, the substrates are rinsed with distilled water or isopropyl alcohol (IPA), and more preferably deionized water. Deionized water is more preferred due to its lack of ions, relatively low cost, and ease of implementation into assembly operations. The rinse step is repeated as many time as necessary to adequately remove solution residue. A post-rinsing step using sulfuric acid in a concentration of 0.1–20%, more preferably 1–10%, can also optionally be used. Such a post-rinsing step is especially beneficial on copper substrates.

The substrate can then be dried so that the substrate can be further processed without undesired dripping and to prevent spotting. However, there is no requirement that the substrates be dried. Most preferably the substrates are not dried when going directly into a plating bath. Forced heated air drying is preferred due to its speed, relatively low cost and ease of implementation into assembly operations. However, other drying techniques can be used, such as, but not limited to chemicals such as IPA (isopropyl alcohol), ambient air, centrifuges and the like.

In addition to using the solution for preparing substrates for electroplating and for cleaning and priming substrates and inner layer core materials and flexible composite materials used in the manufacture of PCBs, the solution can also be applied to chemical milling processes and electroforming. Chemical milling refers in general to fabricating metallic alloys. More specifically, chemical milling refers to processing large metallic sheets into small, discrete metallic components with intricately dimensioned patterns or voids, such as lead frames.

Chemical milling involves applying a photoresist to the front and rear sides of a metallic sheet. The resist-coated metallic sheet is then pattern exposed to actinic radiation in the ultraviolet portion of the spectrum. This exposure allows the protected areas of the resist to be developed away, and the exposed metal can then be completely etched through. Preferably, the metallic sheets include nickel-iron alloys, copper, nickel, cobalt, combinations thereof or the like. By this process, small, discrete metallic parts with intricately dimensioned patterns or voids are made.

The solution of the present invention allows a single solution to, among other purposes, clean, inhibit oxidation and promote adhesion of positive or negative working photosensitive resists, screen inks or other films used in chemical milling manufacture. The cleaning, oxidation inhibition and adhesion promoting properties of the solution are described above. The solution is prepared and applied in the same manner as detailed above. The metallic sheets can thus be coated with the solution or a diluted percentage thereof as described above before application of the resist.

In addition to using the solution for preparing substrates used in electroplating, the manufacture of PCBs, and chemical milling, the solution can also be applied in chemical pattern plating processes. Chemical plating refers in general to processing metallic alloys. More specifically, chemical plating refers to depositing metallic alloys onto substrate materials.

Pattern plating involves applying a resist to a substrate or portions thereof. After the resist is applied, the substrate is exposed in a pattern determined by a negative, positive, or other light blocking film material that blocks radiation in the ultraviolet portion of the spectrum. This exposure allows the resist areas protected by the film to be developed away and subsequently plated. By this process, discrete metals and alloys, such as copper, tin-lead, nickel and gold and patterns thereof can be plated on the substrate.

The solution according to embodiments of the present invention allows a single solution to, among other purposes, clean, inhibit oxidation, protect the substrate and promote adhesion of resists used in chemical plating manufacture. The cleaning, oxidation inhibition, substrate protection and adhesion promoting properties of the solution are described above. The solution is prepared and applied in the same manner as detailed above. The substrates can thus be coated with the solution before application of the resist.

The use of embodiments of the solution in the preparation of substrates for electroplating is described in more detail below.

A filming amine is applied to the substrate in a solution according to an embodiment of the formulated metal cleaner or acid pickle described above. The metal cleaner cleans, removes oxidation and prepares the part for electroplating in a single bath while simultaneously allowing a cationic amine film to form on the substrate. The substrate may also be prepared by conventional cleaning followed by treatment with the formulated metal cleaner or an acid pickle containing an embodiment of this invention.

This process is contrary to conventional electroplating theory and methodology, which mandates a clean, water-wet substrate with no barrier between the substrate and the plating solution. In contrast the solution used in an embodiment of the present invention leaves an organic film on the substrate after cleaning and thereby passivates the metal. According to conventional theory, this should inhibit plating. Unexpectedly, the presence of an amine film on the substrate speeds up the plating process, allows for much faster initial coverage of the substrate being plated, and provides significant coverage in low current density areas. In traditional plating, low current density areas may receive little or no plating at all.

Although the process by which the present method improves electroplating is not fully understood, it is known that filming amines will not form films on metal oxides. Therefore, oxides must be completely removed before the deposition of the amine layer on the metal surface can take place. However, once formed the amine layer acts as an oxidation inhibitor by preventing the immediate re-uptake of oxygen on the substrate metal. The filming amine layer protects the cleaned surface from being reoxidized.

In addition, the filming amine is conductive and therefore does not inhibit the plating process. Since some degree of oxidation cannot be avoided using conventional cleaning techniques, it is believed that the near total lack of oxidation afforded by the filming amine is at least partly behind the remarkable increase in electroplating efficiency. It is likely that other as yet unknown reasons underlie the present invention and thus the present invention is not limited to a reduction in oxidation.

Embodiments of the present invention have also been shown to increase the efficiency of electrophoretic coatings, and embodiments may have applications in pre-cleaning and preparation of substrates for powder coating and other electrical coating processes. Any plating or cladding of a metal substrate involving the flow of ions may be improved by the method of the present invention, regardless of the medium through which the ions move.

EXAMPLE 7

An embodiment of the present invention was tested by plating a rack of steel door hinges in an acid nickel plating bath. The bath contained:

40 ounces/gallon nickel sulfate (10 ounces/gallon based on nickel metal)
5.5 ounces/gallon nickel chloride
5 ounces/gallon boric acid
0.02 wt % Quest 1 (MacDermid Inc, Waterbury, Connecticut) as primary brightener and leveler The pH of the bath was maintained in the range of 3.5 to 4.5 by adding boric acid.

This bath normally takes up to 12 minutes at 80 amps to get adequate coverage. However, plating still results in marginal coverage in the barrel of the hole into which the hinge pin is inserted. Using an embodiment of the present invention at ambient, room temperature, an equivalent rack of steel door hinges in the same plating bath was completely covered with plated nickel in 3 minutes at 25 amps with excellent coverage in the barrel. This amounts to a reduction in plating time of 75% with a greater than two-thirds reduction in energy consumption. In contrast, when an equivalent rack of hinges was cleaned conventionally and plated at 25 amps, there was almost no plating at 3 minutes. Another conventionally cleaned rack showed only partial and spotty coverage after 3 minutes of plating at 50 amps.

EXAMPLE 8

A commercial metal finishing company tested an embodiment of the present invention in an alkaline cadmium plating bath. They observed a 50% increase in plating thickness compared to a conventionally treated control. The company concluded that the embodiment provided a "significant" increase in the throwing power of the bath.

EXAMPLE 9

An embodiment of the present invention was evaluated in a commercial laboratory to determine if it increases the plating efficiency and throwing power of cyanide cadmium plating.

Cadmium cyanide solution was prepared, per McGean/ROHCO 20XL Technical Data Sheet. This is a standard make-up for rack or wire plating. The bath had the following composition:

| Cadmium Oxide | 25.3 g/L |
| Total Sodium Cyanide | 135 g/L |
| Total Sodium Hydroxide | 9.4 g/L |
| Sodium Carbonate | 15 g/L |
| McGean/ROHCO 20XL* | 0.1 volume % |

*Nickel based cadmium brightener system

Four Hull Cell panels 100 mm×67 mm×0.5 mm made of 1020 steel bent in the middle at an angle of 78° were cleaned in a 60 g/l solution of Nuvat alkaline soak cleaner at a temperature between 71 and 82° C. with mild agitation with a magnetic stirrer for 5 minutes. The panels were rinsed in running water.

One set of panels were then immersed for 10 seconds in 10 volume % hydrochloric acid (22 Degrees Baume) at ambient temperature with mild agitation with a magnetic stirrer and was rinsed with running tap water in a conventional pretreat sequence.

The second set of panels was pretreated with a solution according to an embodiment of the present invention. The solution of Example 6 was diluted to 10% of the original concentration with deionized water. The second set of panels was immersed in the diluted solution for 1 minute with mild agitation with a magnetic stirrer. The temperature of the solution was maintained between 41 and 46° C. The panel was then rinsed with running tap water.

Using a cadmium anode in a standard 267 ml Hull Cell, one panel pretreated with a conventional acid dip and one panel pretreated with the solution according to an embodiment of the present invention were plated for 30 seconds at 0.2 amps to determine the speed at which the cadmium would throw into the extreme recess of the panel. The panel pretreated with the conventional pre-clean process was plated to a depth of 3.6 cm, while the panel pretreated with a solution according to an embodiment of the present invention was plated to a depth of 5.0 cm. Only 72% of the panel treated with the conventional pre-clean process was plated, compared to 100% of the panel pretreated with the solution according to an embodiment of present invention.

In another experiment, one panel pretreated with a conventional acid dip and a another panel pretreated with a solution according to an embodiment of the present invention were plated for 10 seconds at 0.2 amps. The panel which was prepared with the conventional pre-clean process was plated to a depth of 2.9 cm, while the panel which was plated to a depth of 5.0 cm. Only 58% of the panel treated with the conventional pre-clean process, was covered with plating, while 100% of the panel treated with the solution according to an embodiment of the present invention was covered with plating.

The covering power of 1020 steel using an embodiment of the method of the present invention was impressive compared to the conventional pre-process system. As is apparent from the numbers, the speed at which the low current density area was covered is significantly greater than with the conventional pre-process. This speed of low current coverage would allow for shorter plating times for thin deposits, give better coverage in low current areas for improved corrosion resistance and in some cases, allow for a reduced dog bone effect when plating copper, nickel, or other metal or alloys into small, high aspect ratio holes.

EXAMPLE 9

Commercial 20 layer multilayer circuit boards, 0.2 inches thick and containing multiple 9:1 high aspect holes were cut into sections 2 7/16"×3 13/16", a size appropriate for a standard Hull cell, and were electroless copper plated to a thickness of $60 \times 10^{-6}$ inches. The control panels were cleaned according to a conventional preplate cleaning method shown below. The test panels were cleaned according to an embodiment of the present invention, as described below.

The panels which were cleaned with the conventional process sequence were cleaned with 10 volume % sulfuric acid at ambient temperature for 2 minutes with mechanical agitation. The panels were then double rinsed with cold running water and were cleaned with 20 volume % DURACLEAN LPH™ preplate cleaner for 5 minutes with mechanical agitation. The panels were then double rinsed with cold running water, washed with 5 volume % sulfuric acid at ambient temperature for 5 minutes, and plated with acid copper.

The panels which were pretreated with a process sequence according to an embodiment of the present invention were treated with a solution of 0.02 wt % ethoxylated (3) N-tallowalkyl-1,2-diaminopropanes neutralized with maleic acid in 10 volume % sulfuric acid. The panels were double rinsed with cold running water. The panels were then treated with a solution of 20 volume % DURACLEAN LPH™ containing 0.02 wt % maleic acid salt of ethoxylated (3) N-tallowalkyl-1,2-diaminopropanes, double rinsed with cold running water, washed with 5 volume % sulfuric acid at ambient temperature for 5 minutes, and plated with acid copper.

DURACLEAN LPH™ is an acid-based preplate cleaner, commercially available from Duratech Industries Inc., Orange, Calif.

The boards were plated using a PCB Hull Cell, which is designed to determine the through hole plating characteristics of electrolytes. Both the control boards and the test boards were plated at 20 amps/ft$^2$ (ASF) for 1, 5, 15, 20, and 30 minutes, respectively, at ambient temperature.

The copper plating solution had the following composition:

| | |
|---|---|
| Copper Sulfate Pentahydrate | 10 oz/gal |
| Sulfuric Acid 66 Degree Baume | 28 oz/gal |
| Chloride | 60 mg/L |
| McGean Best Bond 339 Brightener | 0.5% v/v |

After copper plating, the boards were micro-sectioned, and the copper distribution was determined by comparing the thickness to baseline (the thickness of copper plate on boards prior to processing). Thickness measurements were taken in the center and the opening of the hole.

1 Minute

There was no discernable difference between the control and the test boards. There was also no discernable difference between the deposited copper in the middle and the opening of the hole. The deposit was uniform and smooth.

5 Minutes

In the control boards, there was no discernable difference in the amount of deposited copper in the bore from the initial amount. There was a noticeable increase in the amount of copper near the opening of the hole.

In the test boards, there was a slight increase in the thickness of the copper throughout the bore. The copper was evenly distributed throughout the bore with very little differential in thickness.

15 Minutes

In the control boards, there was no noticeable increase in the thickness of the copper layer in the bore. A considerable amount of copper was deposited near the opening of the hole. The deposit was uneven in nature, with a heavier buildup of copper near the opening of the hole.

In the test board, there was a noticeable buildup of copper in both the bore and the opening. The difference in thickness of the deposited copper between the bore and the opening was very slight.

20 Minutes

In the control board, approximately 4 times as much copper was deposited at the opening than in the bore. The deposit was very uneven.

In the test board, the differential in thickness of the deposited copper between the bore and the opening was very slight.

30 Minutes

In the control board, there was a heavy buildup at the opening with only a slight amount of copper deposition in the bore. The deposit differential was considerable.

In the test board, there was heavy copper buildup at the opening, with moderate deposition in the bore. After 30 minutes of plating, a significant differential was seen between the amount of copper deposited in the bore and the opening.

Treating the circuit boards with a solution according to an embodiment of the present invention before plating therefore greatly improved the covering power of the plating inside the bore of the hole, demonstrating an improvement in the throwing power of the plating solution.

Although there was a significant differential in the amount of copper deposited in the bore than at the opening in the test panel after 30 minutes of plating, the differential in the thickness was still far less than in the control boards. The differential in the amount of copper in the bore hole than at the opening in the test panels was slight through 20 minutes of plating.

An amine was added to the sulfuric acid in the first step of the process sequence with an embodiment of the present invention, because, in the commercial process, a resist layer would be placed on the circuit board after the first step. The amine layer which was placed on the surface of the circuit board as an antioxidant would facilitate the adhesion of the resist layer, as described in more detail in U.S. Pat. No. 6,174,561, hereby incorporated herein by reference in its entirety.

If it was desired to evenly deposit a thicker layer of copper into the bore than the thickness which was obtained after 20 minutes with an embodiment of the present invention, the circuit board could be removed from the plating bath, washed to remove the plating solution, and could be treated again with a solution according to an embodiment of the present invention, thereby depositing a new layer of filming amine on the surface of the circuit board. If the circuit board were to be plated again after the new layer of filming amine has been deposited on the surface, the copper would be deposited evenly again in both the bore and the opening. Repeating the coating process therefore allows thicker layers of electroplated metal to be deposited uniformly inside the bore of the hole and on the surface of the circuit board in less time than by conventional methods.

As an alternative to repeating the coating process, the filming amine could be added to the plating bath in the following example.

EXAMPLE 10

A series of circuit boards are electroplated with copper with the embodiment of the present invention as described in Example 9 with the exception that maleic acid neutralized ethoxylated (3) N-tallowalkyl-1,2-diaminopropanes is added to the electroplating bath before the circuit boards are plated with copper.

The period of time that uniform electroplating occurs inside the bore and on the surface of the circuit board increases from about 15-20 minutes to one or more hours.

Adding a filming amine to the electroplating bath increases the length of time that the electroplating in the bore and the surface of the circuit board is uniform.

The embodiments of the solution, its properties and uses illustrated and described above are provided merely as examples of the composition and method for electroplating, priming circuit boards, chemical milling and chemical plating substrates in accordance with the present invention. Other changes and modifications can be made from the embodiments presented herein by those skilled in the art without departing from the spirit and scope of the invention as defined by the appended claims.

What is claimed is:

1. A method of electroplating a substrate comprising:
providing a solution comprising from about 0.0003% to about 30% of a film forming amine and sufficient acid to produce a pH of less than about 6.5;
coating at least a portion of the substrate with the solution, thereby forming a film on the substrate, wherein said film inhibits oxidation of said substrate; and
plating the substrate.

2. The method of claim 1, wherein the coating comprises immersing the substrate in the solution.

3. The method of claim 1, wherein the coating comprises spraying said at least a portion of the substrate with the solution.

4. The method of claim 1, additionally comprising rinsing the substrate after the coating.

5. The method of claim 1, wherein said solution comprises a plurality of film forming amines.

6. The method of claim 1, wherein said solution comprises a plurality of acids.

7. The method of claim 1, wherein the acid is selected from the group consisting of phosphoric acid, sulfonic acid, hydroxyacetic acid, hydrochloric acid, sulfuric acid, sulfamic acid, formic acid, malonic acid, succinic acid, aspartic acid, mallic acid, acetic acid, citric acid, nitric acid, methane sulfonic acid, gallic acid, maleic acid, and fumaric acid.

8. The method of claim 1, wherein the solution is diluted to not less than about 1% of an initial concentration of said solution.

9. The method of claim 1, further comprising drying the substrate after the coating.

10. The method of claim 1, wherein the acid reduces the pH of said solution to below 4.

11. The method of claim 1, wherein said film forming amine is selected from the group consisting of fatty acid amines and long chain alkylamines.

12. The method of claim 1, wherein said film forming amine is selected from the group consisting of primary amines, secondary amines, tertiary amines; alkylamines; C-8 through C-22 amines; basic mono cyclic tertiary amines, stabilized abietylamines, diaminopropanes, dehydroabietylamines, and ethoxylates, salts and adducts thereof.

13. The method of claim 1, wherein said solution cleans said substrate.

14. The method of claim 1, further comprising depositing a resist layer on at least a portion of said film.

15. The method of claim 14, further comprising removing a portion of said resist layer.

16. The method of claim 15, further comprising pattern plating said substrate.

17. The method of claim 1, further comprising contacting said substrate with an acid pickle solution comprising a film forming amine, wherein said contacting is before plating.

18. The method of claim 1, further comprising repeating said coating after said plating.

19. The method of claim 18, further comprising plating the substrate after repeating said coating.

20. The method of claim 1, wherein said plating is performed in said solution.

21. A method of electroplating a substrate comprising:
providing a solution comprising from about 0.0003% to about 30% of a film forming amine and sufficient acid to produce a pH of less than about 6.5, the solution comprising hydrochloric acid;
coating at least a portion of the substrate with the solution, thereby forming a film on the substrate; and
plating the substrate.

22. The method of claim 21, wherein said solution comprises a plurality of acids.

23. The method of claim 21, wherein said plating is performed in said solution.

24. The method of claim 21, wherein said film inhibits oxidation of said substrate.

* * * * *